United States Patent [19]

Clark

[11] 3,758,831

[45] Sept. 11, 1973

[54] TRANSISTOR WITH IMPROVED BREAKDOWN MODE

[75] Inventor: Lowell E. Clark, Scottsdale, Ariz.

[73] Assignee: Motorola, Inc., Franklin Park, Ill.

[22] Filed: June 7, 1971

[21] Appl. No.: 150,424

[52] U.S. Cl. .......... 317/235 R, 307/302, 317/234 Q, 317/235 T, 317/235 AE

[51] Int. Cl. ......... H01l 5/00, H01l 9/00, H01l 11/00

[58] Field of Search .................. 317/235 T, 235 AE, 317/234 Q; 307/302

[56] References Cited

UNITED STATES PATENTS

| | | | |
|---|---|---|---|
| 2,843,515 | 7/1958 | Statz et al. | 317/235 T |
| 3,571,630 | 3/1971 | Widlar | 317/235 T |
| 3,484,309 | 12/1969 | Gilbert | 317/235 T |
| 3,507,715 | 4/1970 | Kaiser | 317/234 Q |
| 3,483,446 | 12/1969 | Van der Leest | 317/235 T |
| 3,462,656 | 8/1969 | Gerstner et al. | 317/235 T |
| 3,325,706 | 6/1967 | Kruper | 317/235 AE |
| 3,233,125 | 2/1966 | Buie | 317/235 AE |

OTHER PUBLICATIONS

Frederiksen et al., Motorola Monitor, Vol. 8, No. 1, Apr. 1970, pp. 24–25.

Schenkel et al., "Voltage Punch–Through...," Proceedings National Electronics Conference, Vol. 10, 1954, page 614 relied upon.

*Primary Examiner*—John W. Huckert
*Assistant Examiner*—William D. Larkins
*Attorney*—Mueller and Aichelle

[57] ABSTRACT

There is disclosed a transistor with improved protection against excessive reverse biasing voltages. The improved protection is the result of providing a punch-through breakdown mode which is operative to the exclusion of an avalanche breakdown mode. In the improved transistor, the punch-through breakdown current is dissipated over a wide area such that little if any structural damage occurs. The provision of a punch-through breakdown to the exclusion of avalanche breakdown is accomplished by reducing the doping concentration in the base of the transistor under the emitter or by decreasing the distance between the collector-base junction and the emitter-base junction. There is further provided means for controlling the beta of the transistor as the distance between the above two junctions and the base doping concentration are reduced to provide for punch-through breakdown. Means are further provided for causing the punch-through breakdown to occur in a region either removed from the active area of the transistor or confined to a small portion of the active area of the transistor so that the punch-through mechanism does not interfere with the normal operation of the transistor. There is therefore separate control over the gain and the breakdown characteristics of the transistor. The punch-through current is made to flow to the emitter of the transistor whereby the punch-through breakdown current is dissipated over the entire emitter.

5 Claims, 9 Drawing Figures

INVENTOR
Lowell E. Clark
BY
Mueller & Aichele
ATTY'S

INVENTOR.
Lowell E. Clark
BY
Mueller & Aichele
ATTY'S

TRANSISTOR WITH IMPROVED BREAKDOWN MODE

BACKGROUND OF THE INVENTION

This invention relates to semiconductor devices and more particularly to both a method and apparatus for protecting transistor type devices against reverse biasing conditions which would ordinarily destroy them.

Transistor type semiconductor devices in general can be very easily destroyed by the application of an excessive reverse bias between the collector and the emitter of the transistor. The primary mechanism of the destruction of these transistors when excessive reverse bias is applied is avalanche breakdown. Avalanche breakdown is a localized multiplicative type breakdown usually originating at the collector-base junction. When a certain voltage level is reached, the electric field created by the voltage imparts sufficient energy to the carriers to that they can ionize other carriers from atoms in the immediate vicinity. This results in a localized increase in current flow. The energy thus produced is primarily heat which is usually distributed over a very small localized area surrounding the original point of avalanche. This, together with the transistor action, results in a thermal breakdown of the material in this one localized area.

It is the purpose of this invention to cause a breakdown of another variety. This breakdown is called "punch-through" breakdown which is made to occur before the more destructive avalanche breakdown can occur. Punch-through breakdown is not prone to occur in any one single area but occurs across a large area as the depletion spread moves from the collector-base junction of a transistor towards its emitter. Unlike prior art punch-through protection systems which protect the emitter from punch-through depletion spreads, it is the purpose of this invention to deliver punch-through current to the emitter. The area of the emitter in most transistors is quite large as compared to the area at which avalanche breakdown occurs. During punch-through, therefore, the energy is dissipated across the large area emitter and therefore causes no structural damage to the transistor itself.

In the preferred embodiment there are structural improvements to the transistor which channel punch-through currents to a punch-through region such that the majority of the active region between the collector-base junction and the emitter-base junction is not subjected to punch-through currents. The punch-through current is rerouted to the emitter by various of the structural devices to be described hereinafter.

The principal mechanism for causing punch-through breakdown prior to avalanche breakdown is in the control of the width of the base region between the emitter and the collector and by controlling the impurity concentration in the base of the transistor beneath the emitter. The base region between the emitter and collector is called the active region. In general, when both the active region width is reduced and when the base impurity concentration is reduced, punch-through can be made to occur prior to and to the exclusion of avalanche breakdown. The occurrence of punch-through breakdown prior to avalanche breakdown is advantageous because once punch-through breakdown occurs, avalanche breakdown is prevented in a self-limiting process. This is advantageous in both power transistors and in small signal transistors for the following reasons.

When power transistors are used to control current to and from an inductor, it will be appreciated that once current to the inductor is interrupted, there is a finite time in which the inductor de-energizes, forcing current to flow in a reverse direction. When current flows in this reverse direction, a power transistor in its path may become excessively reverse biased. It will be appreciated that the amount of current which will destroy the power transistor in the forward direction is about a hundred times greater than that which will destroy the power transistor in a reverse biasing direction. It is therefore both desirable and necessary to provide a means, such as punch-through, for dissipating this de-energization current so as to prevent destruction of the power transistor. If this de-energization current is passed through the power transistor in a punch-through breakdown mode, the power transistor is not permanently destroyed but rather returns to its original operating function after the indicator deenergizes. It will be appreciated that these type power transistors can be utilized to advantage both in motor control circuits and in auto ignition circuits. Further, by use of the aforementioned punch-through mechanism, smaller transistors may be utilized in place of the large transistors now utilized.

A further application of the punch-through mechanism occurs in transistor testing. It will be appreciated that a standard testing procedure utilized to test completed transistors involves what is known as a CBO test. In a CBO test, a reverse biasing current, typically at 1 milliamp, is provided in order that the breakdown voltage of the transistor can be ascertained. However, in the process of testing these transistors for CBO characteristics, many transistors are damaged if the test causes switching of the transistor into a localized CEO breakdown, or if the emitter-base junction is avalanche. If the subject punch-through technique and structures are utilized in the fabrication of all small transistors, then even if the reverse bias supplied in the CBO mode to test the transitors is excessive, it casues punch-through breakdown rather than avalanche breakdown such that the small transistor, instead of being destroyed can in fact be utilized. These small transistors are protected in precisely the same way that the power transistors are protected in that the breakdown current is dissipated over a large emitter area reather than a small localized area as is the case in avalanche breakdown. It will be appreciated that even though the small transistor punches-through, its operation is not degraded and it may continue through the testing procedure. It should be noted that reducing the base doping and thickness in order to provide for punch-through breakdown may result in excessively large values of current gain, $\beta$. Hence, another objective of this invention is to separate the punch-through region from the active region in such a fashion that independent control over gain and punch-through voltage may be exerted. Means are provided such that this independent control does not preclude the desired function of power dissipation over a maximum area (the emitter).

SUMMARY OF THE INVENTION

It is therefore an object of this ivention to provide a transistor with an improved tolerance to excessive reverse biasing conditions.

It is a still further object of this invention to provide a method of protecting transistors from physical degradation due to excessive reverse biasing voltages.

It is a still further object of this invention to provide a transistor with a punch-through mode of breakdown which occurs prior to any avalanche breakdown mechanism and which therefore eliminates avalanche breakdown in the particular transistor.

It is a still further object of this invention to provide an improved transistor which favors the punch-through mode of breakdown and whose $\beta$ characteristics is limited and controlled to a reasonable value by the use of an auxiliary emitter region in combination with an auxiliary heavily doped portion of the base region which portion is adjacent to the original emitter of the transistor.

It is a still further object of this invention to provide an improved transistor which breaks down in the punch-through mode in which the punch-through region is confined to a narrow region immediately under the emitter region of the transistor such that the majority of the active region of the emitter is unaffected by the provision of the punch-through region.

Other objects and features of this ivnention will become more fully apparent upon reading the following description in connection with the accompanying drawings.

BRIEF DESCRIPTION OF THE INVENTION

There is disclosed a transistor with improved protection against excessive reverse biasing voltages. The improved protection is the result of providing a punch-through breakdown mode which is operative to the exclusion of an avalanche breakdown mode. In the improved transistor, the punch-through breakdown current is dissipated over a wide area such that little if any structural damage occurs. The provision of a punch-through breakdown to the exclusion of avalanche breakdown is accomplished by reducing the doping concentration in the base of the transistor under the emitter or by decreasing the distance between the collector-base junction and the emitter-base junction. There is further provided means for controlling the beta of the transistor as the distance between the above two junctions and the base doping concentration are reduced to provide for punch-through breakdown. Means are further provided for causing the punch-through breakdown to occur in a region either removed from the active area of the transistor or confined to a small portion of the active area of the transistor so that the punch-through mechanism does not interfere with the normal operation of the transistor. There is therefore separate control over the gain and the breakdown characteristics of the transistor. The punch-through current is made to flow to the emitter of the transistor whereby the punch-through breakdown current is dissipated over the entire emitter.

DETAILED DESCRIPTION OF THE INVENTION

Figure 1:
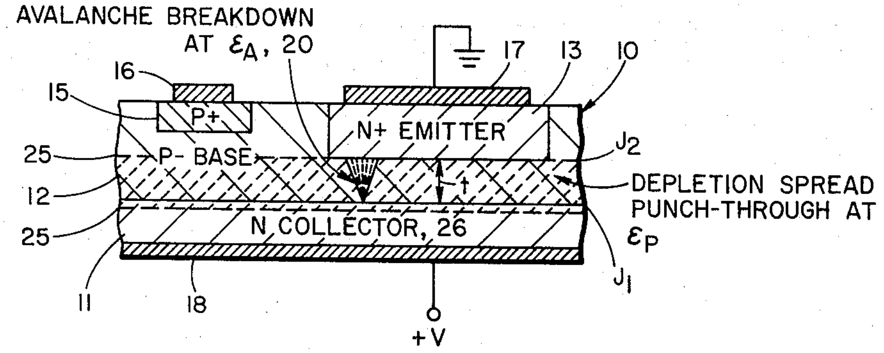
FIG. 1 is a cross sectional drawing of a transistor showing the relationship between punch-through breakdown and avalanche breakdown, also indicating the parameters in the manufacture of the transistor which are responsible for the punch-through breakdown preference.

Referring now to FIG. 1, a transistor 10 is shown with an N collector region 11, a P- base region 12 and an N+ emitter region 13. Contact is made to the base region 12 via a P+ diffusion 15 and a contact 16 thereon. Contact is made to the N+ emitter region via the contact 17 while contact is made to the N collector region 11 via a contact 18.

The two aforementioned types of breakdown are shown in this figure. Avalanche beakdown is shown by the arrow 20 to occur at a field strength $\epsilon_A$ at collector base junction, $J_1$. As can be seen, in this case avalanche breakdown occurs at the collector-base junction $J_1$ and proceeds in a narrow cone towards the emitter region 13. The curent then flows out the emitter region 13 via the contact 17, which in this case is shown grounded. A large portion of the dissipated energy is thermal energy which causes breakdown in the base material. On the other hand punch-through breakdown occurs in the area of depletion spread as shown by the dotted shading lines and the dotted lines 25. The depletion spread originates at the collector-base junction and grows both into the base region and the collector region. A large portion of the energy in the depletion spread is distributed evenly across the area subtended by the emitter 13 such that any thermal energy which is generated by punch-through breakdown is dissipated over a large emitter area which is capable of caryring the current without substantial heating. Punch-through breakdown occurs when the electric field potential at the emitter-base junction, $J_2$, goes positive. This corresponds to a given field potential, $\epsilon_P$, at $J_1$ and to the depletion spread reaching the emitter-base junction, $J_2$. It is possible by altering the normal impurity concentration in the base, as well as the distance "t" between junctions $J_1$ and $J_2$, to cause punch-through breakdown with an electric $\epsilon_P$ field potential at $J_1$, $\epsilon_p$, which is less than that electric field at $J_1$ which causes avalance breakdown, i.e., $\epsilon_A$. In general, if the normal base impurity concentration is reduced by a factor of five, punch-through will occur before avalanche. Alternately, the depth of the emitter-base junction $J_2$ may be increased from the normal value, causing the width of the region denoted by $t$ to be reduced by a factor of as much as five, thereby causing punch-through to occur prior to avalanche. It will be further appreciated that by a combination of reducing the base concentration and reducing the punch-through region thickness the same result can be achieved. This is diagrammatically shown in connection with FIGS. 2a–2d. In FIGS. 2a–2d the electric field through the various regions, $\epsilon$, is graphed against distance denoted by the letter X.

Figure 2A:
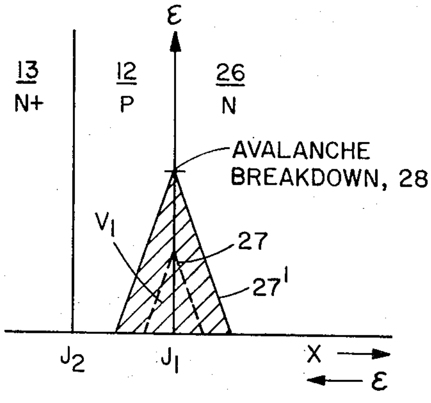
FIGS. 2*a*–2*d* are graphs showing the electrical field through two of the active regions of the transistor indicating the condition at which punch-through breakdown occurs.

Referring to FIG. 2a, the mechanism of avalanche breakdown is shown. In this diagram the field strength $\epsilon$ is shown through an N collector region corresponding to the collector 26, a P base region corresponding to the base region 12 and an N+ region corresponding to the emitter region 13. Fields from right to left are defined as positive. The vertical lines at $J_1$ and $J_2$ represent the junctions between the collector and base and the base and emitter, respectively. The electric field lines are shown as dotted lines 27 and solid line 27'. It will be appreciated that the area under each one of the lines 27 or 27' corresponds to a voltage. There is a point at the junction $J_1$ at which avalanche breakdown occurs. This point ($\epsilon_A$) is labelled by the reference character 28 and generally occurs in silicon at $\epsilon$=10–50V/$\mu$. It is at this electric field potential that avalanche breakdown is stimulated at junction $J_1$. As the reverse biasing voltage increases, as shown by the electric field rising from the lower dotted line 27 to the solid line 27', no breakdowns occur in the transistor. When, however, the electric field generated by the reverse biasing voltage reaches the point shown at 28, avalanche breakdown occurs in the aforementioned manner. This voltage, i.e., that which is necessary to stimulate avalanche breakdown, is shown as the shaded area designated $V_1$.

It wil be appreciated that the slope of the lines 27 and 27' shown in FIG. 2a, are a direct result of the relative doping concentrations in the collector region 26 and the base region 12. It is the object of this invention to provide that, as the reverse biasing voltage increases across the transistor, punch-through breakdown occurs prior to avalanche breakdown. This is made possible by either decreasing the doping concentration in the base region or by decreasing the punch-through region width, as mentioned hereinbefore.

Figure 2C:
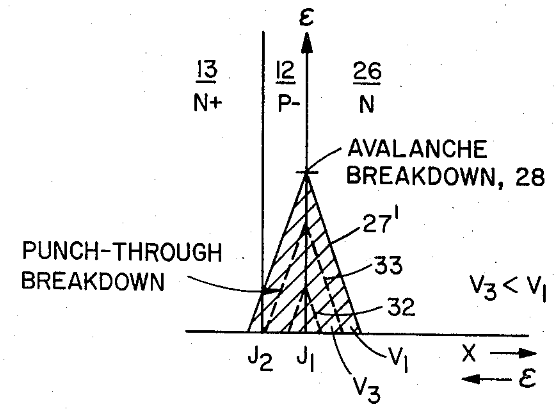
Figure 2B:
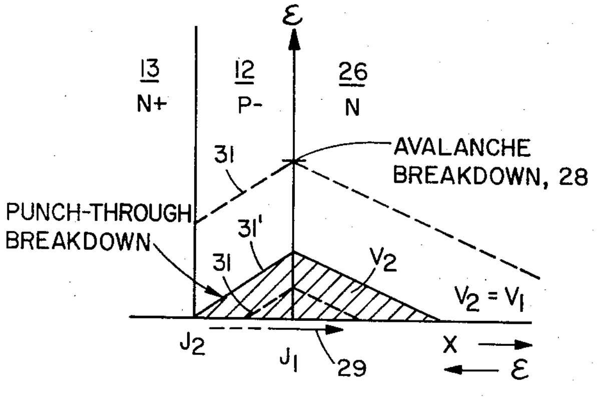

Referring now to FIG. 2b, the mechanism of punch-through breakdown is described. It will be appreciated that the base region 12 has been provided with a decreased impurity concentration resulting in a more gradually sloped electric field line therethrough. It will be further noted that the impurity concentration in the collector region 26 has likewise been reduced. This results in the field configurations denoted by the dotted lines 31 and the solid line 31'. Taking the area under the line 31' equal to $V_2$, it will be appreciated that $V_2$ can be made equal to $V_1$ of FIG. 2a. From inspection of FIG. 2b, it will be noted that the avalanche breakdown electric field potential 28 is not reached. Rather, the depletion spreads to junction $J_2$ prior to the time that avalanche breakdown 28 occurs. With the electric field, $\epsilon$, in the direction shown, when the depletion spread reaches junction $J_2$ electrons from this junction are accelerated in the direction shown by arrow 29 causing a substantial current flow known as punch-through breakdown. In this invention, this current flow is distributed over the entire emitter region of the transistor so that the transistor is not destroyed by a thermal breakdown. Thus, as the reverse biasing voltage across the transistor is increased, punch-through breakdown occurs before avalanche breakdown can occur. Punch-through breakdown is a self-limiting type breakdown such that avalanche breakdown 28 will never occur once punch-through breakdown occurs. It can thus be seen that in one case the same reverse biasing voltage produces an avalanche breakdown while in the latter case, it produces a punch-through breakdown. With respect to FIG. 2b, it will further be noted that it is the P- doping concentration in the base which permits punch-through breakdown prior to avalanche breakdown.

Referring now to FIG. 2c, this doping concentrations in regions 26, 12 and 13 are maintained as they were in FIG. 2a. However, the distance between junction $J_1$ and $J_2$ is reduced. As can be seen, as the reverse biasing voltage is increased from the dotted line 32 to the dotted line 33, no breakdown occurs. However, when the voltage $V_3$ increases to the level which causes the electric field to go positive at $J_2$ punch-through breakdown occurs. As can be seen from FIG. 2c, punch-through breakdown occurs at a lower voltage than that which causes avalanche breakdown. What this means is that transistors can now be designed with punch-through breakdown voltages considerably less than avalanche breakdown voltages so as to minimize power dissipation in breakdown.

Figure 2D:
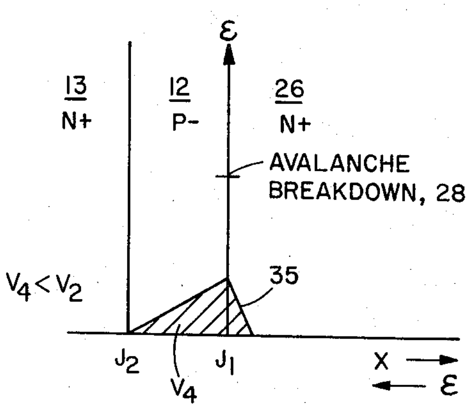

As can be seen in comparing FIGS. 2c with FIGS. 2a and 2b, it is possible to reduce the voltage at which the transistor breaks down in the punch-through mode by reducing the active area width and base impurity concentrations. This voltage may be even further reduced as shown in FIG. 2d. Those portions to the left of junction $J_1$ in FIG. 2d are precisely the same as the conditions which apply with respect to FIG. 2b. However, the region 26 has now become a highly doped region, resulting in the slope of the electric field line being quite steep. This steep slope is denoted by the line 35. Since it will be appreciated that the area, $J_4$, in FIG. 2d is less than the area under the line 31' in FIG. 2b, the voltage which is necessary to cause punch-through breakdown can be made less by the provision of a highly doped collector region.

It is sometimes, however, undesirable to have a highly doped collector region. This same reduction in punch-through voltage can be achieved by a localized buried layer at the collector-base junction. This buried layer does not affect the normal operation of the transistor but does provide that the punch-through voltage be reduced. Since punch-through does not damage the transistor, it is oftentimes desirable to have the transistor punch-through at very, very low voltages so as to comletely protect the transistor from excessive reverse biasing potentials. The buried layer concept which provides for this exceptionally low braekdown voltage will be further discussed in connection with FIG. 6 hereinafter.

Referring back to FIG. 1, the doping concentrations in a typical silicon transistor which cause punch-through prior to avalance are as follows:

TABLE I

| | |
|---|---|
| Collector: | $10^{16}$ atoms/cm$^3$ (5 mils thickness) |
| Base: | $10^{15}$ atoms/cm$^3$ (8$\mu$ thickness under emitter) |
| Emitter: | $10^{20}$ atoms/cm$^3$ (5$\mu$ thickness) |

However, these doping concentrations are only qualitative because of doping profiles and the fact that rectilinear distributions are not now possible. A more general description of the doping concentrations is given by the "dot" product of the thickness of the region, $t$, and the average doping level in this region N. Thus in the above embodiment, the $N \cdot t$ concentrations for the base and emitter regions (assuming the collector so heavily doped that the depletion spread in the collector is negligible) are:

Base (punch-through region): $<8 \times 10^{11}$ atoms/cm$^2$

Emitter: $>5 \times 10^{16}$ atoms/cm$^2$

As a specific example, in order to achieve punch-through at 50 volts, the following $N \cdot t$ concentrations in the punch-through region can be employed:

TABLE II

| N: Doping Concentration In Punch-through Region | $t$ (Thickness of Punch-through Region | N·t |
|---|---|---|
| $6\times10^{14}$ atoms/cm$^3$ | $10\times10^{-4}$ cm | $6\times10^{11}$/cm$^2$ |
| $2.5\times10^{14}$ | $15\times10^{-4}$ cm | $4\times10^{11}$/cm$^2$ |
| $1.5\times10^{14}$ | $20\times10^{-4}$ cm | $3\times10^{11}$/cm$^2$ |
| $5\times10^{15}$ | $3.5\times10^{-4}$cm | $2\times10^{12}$/cm$^2$ |
| $1.0\times10^{16}$ | $8\times10^{-4}$ cm | $8\times10^{11}$/cm$^2$ |

As can be seen the punch-through condition results in silicon when $N \cdot t <5 \times 10^{12}$ atoms/cm$^2$. Thus punch-through is a true function of both the base impurity concentration (under the emitter) and the punch-through region thickness. Obviously both N and $t$ can be varied to achieve other design parameters while at the same time insuring punch-through mode breakdown.

Figure 3:
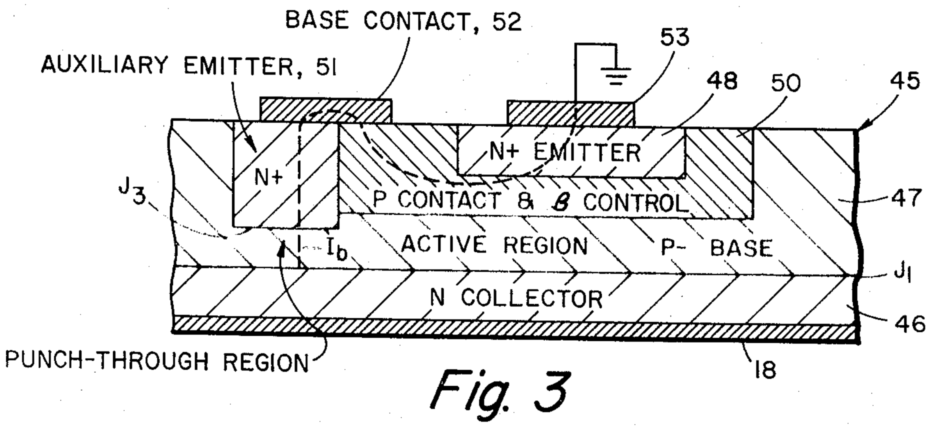
FIG. 3 is a cross sectional view of a transistor in which an auxiliary emitter as well as a beta control region is utilized to define a punch-through region, to connect the punch-through region to the emitter, and to provide for a controllable beta for the transistor.

There is, however, one overriding difficulty with the structure shown in FIG. 1. While it is true that punch-through occurs before breakdown, by reducing both the active area width and the impurity doping concentration in the base, there can be an order of magnitude increase in the beta of the transistor. For some applications, this beta may increase from 100 to as much as 2,000 to 3,000. This being undesirable, in some applications, the active area of the transistor is protected from punch-through while an auxiliary punch-through region is provided to this end, the base region around the emitter is made more highly doped to maintain the beta of the transistor at a figure on the order of 100. This more highly doped portion of the base region is shown in FIG. 3 at 50. In this figure, a transistor 45 is shown with an N collector 46, a P-base 47 and an N+ emitter 48. Surrounding the N+ emitter is the P contact and beta control region 50 which has an impurity concentration such that the total number of impurity atoms per unit area beneath the emitter 48 (i.e., regions 50 and 47 combined) is on the order of $5 \times 10^{12}$/cm$^2$ in order to control the $\beta$ to about 100. If the combined regions 47 and 50 under the emitter were to have a combined concentration of less than $5 \times 10^{12}$ atoms/cm$^2$, punch-thorugh would occur prior to avalanche. However an undesirably high $\beta$ would also result. Punch-through is therefore made to occur in a region to one side of the emitter region such that the punch-through current is then channeled to the highly doped base region and then to the emitter. For this purpose an auxiliary emitter region 51 is formed to the left of region 50 having a junction depth exceeding that of emitter region 48. Auxiliary emitter region 51 is made deep to insure punch-through breakdown at the auxiliary emitter 51, rather than the original emitter 48. In other words, by making $t$ small under the auxiliary emitter 51, the quantity $N \cdot t$ assures that punch-through breakdown occurs at this emitter regardless of the other transistor parameters. However, this requires two emitter diffusion steps.

Both emitters can be simultaneously formed and still perform the functions of 1) having punch-through occur at emitter 51 and 2) providing a high enough $N \cdot t$ beneath emitter 48 to control the beta of the transistor. If the base region under both the emitter 51 and the emitter 48 has a concentration of $<5 \times 10^{12}$ atoms/cm$^2$, and assuming the concentration in the region 50 beneath the emitter 48 is $\upsilon 10^{13}$ atoms/cm$^2$ then two things occur. First, punch-through occurs at the auxiliary emitter 51. Secondly, the impurity concentration in the area under the emitter 48 is the integrated "average" of the concentrations of regions 47 and 50 and can be designed to be $>5 \times 10^{12}$. Thus the concentration in the area under emitter 48 (from $J_1$ to $J_2$) is enough greater than $5 \times 10^{12}$ atoms/cm$^2$ that $\beta$ is limited. What has been created in a single emitter diffusion step is a transistor which operates at an acceptable $\beta$ while at the same time providing a punch-through region which does not interfere with the operation of the transistor.

Since the region 50 is part of the base of the transistor the other purpose of the region 50 is to provide a contact to the base region 47. In the configuration shown, the punch-through region is diverted to one side of the transistor. This punch-through region is shown as the region under the auxiliary emitter region 51 between the junction $J_1$ and the auxiliary emitter-base junction $J_3$. As shown by the dotted line $I_b$, the current during punch-through goes through the auxiliary emitter region 51, through a base contact 52 and back through the region 50 where it is dissipated acros the whole extent of the emitter 48 as was the case in FIG. 1. Here the contact 53 to the emitter 48 is grounded as was the case in FIG. 1. What is accomplished by this structure is the provision of a punch-through region which does not degrade the overall operation of the transistor by increasing the transistor's beta. The energy, as before, is dissipated throughout the entire extent of the emitter 48, since the auxiliary emitter 51 is shorted to the base.

In some cases, the region 50 may be omitted and the auxiliary emitter shorted to the P- base directly. This has an advantage over the structure shown in FIG. 1 since the transistor may be configured with a sufficient $J_1$–$J_2$ distance to preclude high betas while at the same time providing for punch-through breakdown. The punch-through current in this case flows up the auxiliary emitter, across to the base adjacent the regular emitter, and out the regular emitter.

Figure 4:
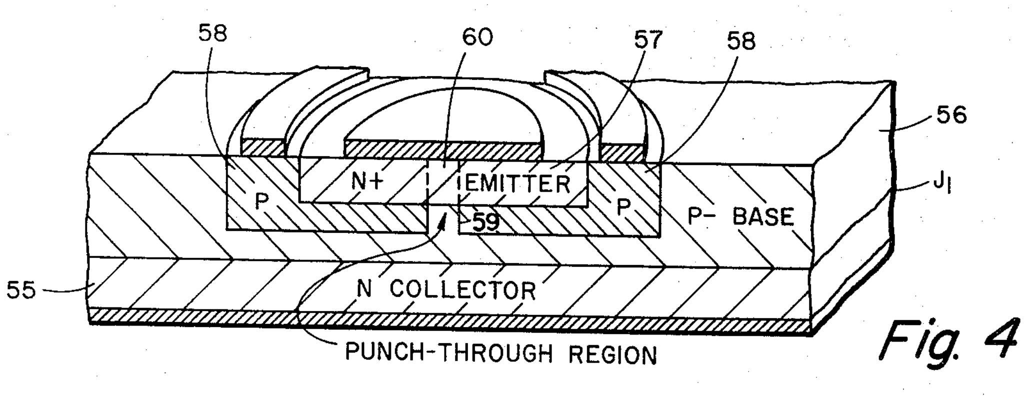
FIG. 4 is a cross section diagram showing an alternate embodiment in which the punch-through region is confined to a central region of the emitter of the transistor shown.
Figure 5:
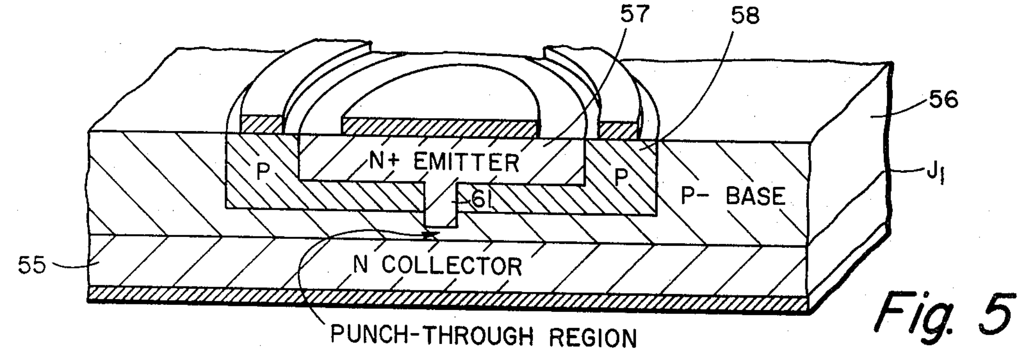
FIG. 5 is a further alternate embodiment showing the punch-through region defined by a deep diffusion from the emitter region.
Figure 6:
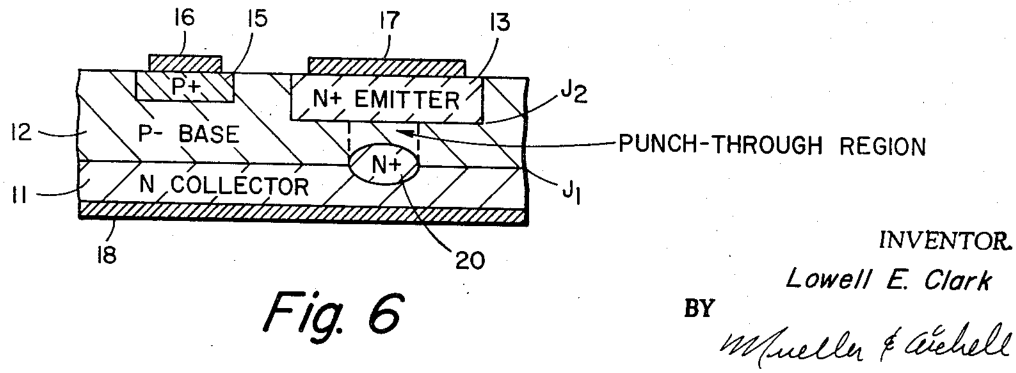
FIG. 6 is a still further alternate embodiment showing a punch-through region limited to the region immediately above a buried layer.

It will be appreciated that the conductivity types of the various regions shown in FIGS. 1 and 3, as well as the following FIGS. 4, 5 and 6 can be reversed to provide the same protection for an NPN as well as a PNP type transistor. The approximate impurity concentrations for the transistors shown in FIGS. 1, 3, 4 and 5 are as follows: Collector impurity concentration $10^{14}$—$10^{18}$/cm$^3$; Base impurity concentration $<10^{12}$/cm$^2$; Emitter impurity concentration $>10^{15}$/cm$^2$; Auxiliary emitter impurity concentration (where applicable) $>10^{15}$/cm$^2$; P contact and beta control region impurity concentration beneath emitter (where applicable) $\upsilon 10^{13}$/cm$^2$.

Referring now to FIG. 4, it is possible to provide a punch-through region in the center of the emitter of a transistor while still maintaining a controllable beta. This is shown by the transistor illustrated in FIG. 4. This transistor is comprised of an N collector region 55, a P- base region 56 and an N+ emitter region 57. Surrounding this emitter region, except for the central portion, is a P base contact and beta control region 58. This region completely surrounds the emitter region 57 except for an area 60 which in one embodiment is circular. In this configuration the region 58 is also of a circular configuration with a hole in the middle. This hole is denoted by the reference numeral 59. The proximity of the emitter portion 60 to the junction $J_1$ of this transistor in conjunction with the low active area impurity concentration in the base is such as to cause punch-through breakdown to occur before avalanche breakdown. Breakdown occurs through the hole 59, passing the base current through the emitter 57 such that the energy generated during the breakdown is dissipated again across the entire emitter. An alternate configuration to this embodiment is shown in FIG. 5. In this case, a deep N+ diffusion is provided through the P region 58 as shown at 61 which causes punch-through at the center of the emitter. It will be appreciated that in this case the active area width is reduced by the deep diffused region 61 such that the P- base region need not be so lightly doped. It will be appreciated that concentrations bearing a "+" sign are in the range of $10^{18}$–$10^{20}$/cm$^3$; concentrations in which no sign is used are in the range of $10^{14}$–$10^{18}$/cm$^3$; and concentrations in which the minus sign is used are in the range of $10^{14}$–$10^{16}$/cm$^3$.

In one further configuration, the punch-through region is limited to only a portion of the emitter by a buried layer 70 as shown in FIG. 6. The rest of the active elements of the transistor are labelled similarly to those corresponding elements in FIG. 1. In this configuration, the buried layer 70 provides that the punch-through breakdown voltage be even less for a corresponding transistor, such as that shown in FIG. 1. This was explained in conjunction with FIG. 2*d*. In FIG. 2*d* the sharper descent of the field line 35 is a direct result of the buried layer 70 which has an impurity concentration of approximately $10^{18}$/cm$^3$ in one configuration. It will be appreciated from inspection of the graph shown in FIG. 2*d* that the area under the line 35 is considerably less than the area under the line 31' in FIG. 2*b*. Since the area under the line 35 is less, the corresponding voltage necessary to institute punch-through is correspondingly less. The protection thus afforded enables the production of transistors which need not be as large as those transistors which are not provided with the subject punch-through mechanisms. Thus, for a given application, a transistor having a lower power rating may be utilized in place of one having a higher power rating when the subject technique is utilized. It will be further appreciated that the buried layer technique enables the use of lightly doped collectors giving the collector a very heavy doping at the punch-through region. This buried layer approach can be utilized in combination with any of the approaches shown in connection with FIGS. 1, 3, 4 and 5.

Thus, both a method and apparatus have been shown which enables a transistor to break down in a punch-through as opposed to an avalanche mode. This is accomplished by varying the electrical characteristics of the active area in conventionally configured transistors or by providing an auxiliary punch-through region having the required $N \cdot t$ characteristic. In the latter configuration $\beta$ control mechanisms can be provided to achieve punch-through breakdown while maintaining a low $\beta$ for the transistor.

What is claimed is:

1. Apparatus for minimizing the vulnerability of a transistor to excess reverse biasing voltages comprising:

means for insuring that punch-through breakdown due to depletion spread in said transistor occurs prior to avalanche breakdown anywhere in the bulk of said transistor when an increasing reverse biasing potential is applied between the emitter and collector of said transistor;

wherein the impurity concentration N, of the base region of said transistor is reduced and wherein the distance, $t$, between the emitter-base junction and the collector-base junction of said transistor is reduced such that $N \cdot t$ is less than that number below which punch-through breakdown is insured;

including a region functioning as part of the base region of said transistor interposed between portions of the emitter and base regions of said transistor, said interposed regions being of like conductivity to that of said base region and having a higher impurity concentration than that of said base, said interposed region permitting the control of the beta of said transistor when the impurity concentration of said base region is reduced; and wherein said interposed semiconductor region completely surrounds said emitter region, said transitor further including an auxiliary emitter region diffused into said base region and being electrically shorted to said interposed region the doping of the base region under said auxiliary emitter region and the distance between the bottom of said auxiliary emitter and the collector-base junction being such that punch-through occurs in said base region between the collector-base junction and the auxiliary emitter-base junction, the breakdown current being transported through said auxiliary emitter through said interposed region and through the first emitter of said transistor.

2. The apparatus as recited in claim 1 wherein both the original and auxiliary emitters are diffused in one processing step to equal depths, the impurity concentration in the base region under said auxiliary emitter being such as to cause punch-through breakdown at said auxiliary emitter, the average impurity concentration of the portions of said interposed region and the base region under said original emitter being such as to preclude punch-through therat and such as to maintain the current gain of said transistor at a controlled level.

3. The apparatus as recited in claim 2 wherein said transistor is silicon, wherein the impurity concentration between said auxiliary emitter and said collector is less than $5 \times 10^{12}$ atoms/cm$^2$ and wherein the average impurity concentration between said original emitter and said collector is greater than $5 \times 10^{12}$ atoms/cm$^2$.

4. Apparatus for minimizing the vulnerability of a transistor to excessive reverse biasing voltages comprising:

means for insuring that punch-through breakdown due to depletion spread in said transistor occurs prior to avalanche breakdown anywhere in the bulk of said transistor when an increasing reverse biasing potential is applied between the emitter and collector of said transistor; and said means includes an auxiliary emitter region spaced from the original emitter region of said transistor, said auxiliary emitter region extending down into the base region of said transistor a distance greater than that of said original emitter, said auxiliary emitter region being shorted to said base regions such that any punch-through current passes through said auxiliary emitter region to said base region and then to said original emitter region, the distance, $t$, between the bottom of said auxiliary emitter region and the collector-base junction of said transistor times the impurity concentration N of the base region under said auxiliary emitter region being such as to insure punch-through breakdown at said auxiliary emitter region prior to either punch-through breakdown at said original emitter or avalanche breakdown anywhere in the bulk of said transistor.

5. The apparatus as recited in claim 4 wherein said transistor is silicon and wherein said $N \cdot t$ product is less than $5 \times 10^{12}$ atoms/cm$^2$.

* * * * *